(12) United States Patent
Myerson et al.

(10) Patent No.: US 8,298,755 B2
(45) Date of Patent: *Oct. 30, 2012

(54) METHODS FOR PRODUCING ORGANIC NANOCRYSTALS

(75) Inventors: Allan S. Myerson, Chicago, IL (US); In Sung Lee, Chicago, IL (US)

(73) Assignee: Illinois Institute of Technology, Chicago, IL (US)

( * ) Notice: Subject to any disclaimer, the term of this patent is extended or adjusted under 35 U.S.C. 154(b) by 1091 days.

This patent is subject to a terminal disclaimer.

(21) Appl. No.: 12/181,055

(22) Filed: Jul. 28, 2008

(65) Prior Publication Data

US 2010/0021851 A1    Jan. 28, 2010

(51) Int. Cl.
*G03F 7/20* (2006.01)

(52) U.S. Cl. .................................................... 430/324

(58) Field of Classification Search .................. None
See application file for complete search history.

(56) References Cited

U.S. PATENT DOCUMENTS

| 7,329,592 | B2 * | 2/2008 | Myerson et al. | 438/497 |
| 2003/0170999 | A1 * | 9/2003 | Myerson | 438/712 |
| 2006/0213425 | A1 * | 9/2006 | Myerson et al. | 117/68 |
| 2010/0021744 | A1 * | 1/2010 | Myerson et al. | 428/426 |

OTHER PUBLICATIONS

Guang et al. "Fabrication ordered voids in a colloidal crystal film substrate system using organic liquid patterns as templates" Adv. Mater. 2002, 14, No. 24, Dec. 17.*

* cited by examiner

*Primary Examiner* — Cynthia Kelly
*Assistant Examiner* — Anna Verderame
(74) *Attorney, Agent, or Firm* — Laurence P. Colton; Smith Risley Tempel Santos LLC

(57) ABSTRACT

Methods for producing small crystals on islands formed on specialized substrates by, inter alia, subjecting the substrate to a hydrophilic SAMs solution for self-assembling hydrophilic SAMs on certain portions of the substrate surface and subjecting the substrate to a hydrophobic SAMs solution for self-assembling hydrophobic SAMs on certain other portions of the substrate surface.

8 Claims, 8 Drawing Sheets

FIG. 14
Hydrophilic Polymer Film
Coating Photoresist Film on the hydrophilic polymer Substrate
Pattern Mask
Photoresist Film
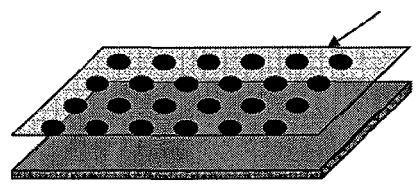
Photo Lithography
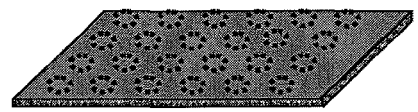
Coating hydrophobic material on top of photoresist film
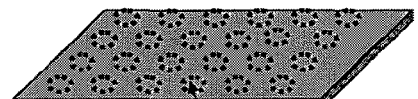
Areas unexposed to UV light
Remove the areas unexposed to UV light
Exposed Polymer Surface

METHODS FOR PRODUCING ORGANIC NANOCRYSTALS

BACKGROUND OF THE INVENTION

1. Technical Field

This invention relates generally to methods for producing organic nanocrystals on substrates and more particularly to methods for producing organic nanocrystals using a combination of hydrophobic and hydrophilic self-assembling monolayers.

2. Prior Art

Crystallization from solution is an important separation and purification process in the chemical process industries. It is a primary method for the production of a wide variety of materials ranging from inorganic compounds to high value-added materials. In addition to product purity, crystallization must also produce particles of the desired size, shape, and form. Specific conditions are necessary to crystallize chemical materials with a specific polymorph crystal form and size. Such conditions include the pH, temperature, ionic strength, and specific concentrations of salts, organic additives, detergents, and impurities in the solution. As different conditions may allow the generation of different forms and sizes of the crystals, it is often difficult to achieve or obtain the specific conditions for crystallizing a crystal with a specific form and size. As such, it is often useful to screen and test conditions that may potentially be suitable for crystal growth.

Organic monolayer films have been used as an interface across which geometric matching and interactions, such as van der Waals forces and hydrogen bonding, can transfer order and symmetry from the monolayer surface to a growing crystal. Nucleation and growth of organic crystals, nucleation rates, polymorphic selectivity, patterning of crystal, crystal morphology, and orientation (with respect to the surface) can undergo modification through site-directed nucleation. This can be achieved using supramolecular assemblies of organic molecules, such as chemically and spatially specific surfaces. Compressed at the plane of water/air interface, Langmuir monolayers are mobilized by, and commensurate with, the adsorption of aggregates during crystallization.

Self-assembled monolayers (SAMs) are single layers of ordered molecules adsorbed on a substrate due to bonding between the surface and the molecular head group. SAMs are molecular units that are spontaneously formed upon certain substrates, such as gold and silicon, when immersed in an organic solvent. One of the better known methods to form SAMs is when alkanethiol molecules chemisorb on gold surfaces through the thiol head group to reproducibly form densely packed, robust, often crystalline monolayer films. The surface chemical and physical properties of the monolayer films can be controlled precisely by varying the terminal chemical functionality of the alkanethiol molecule.

SAMs and mixed SAMs lack the mobility of molecules at an air-water interface and, hence, lack the ability to adjust lateral positions to match a face of a nucleating crystal. This is especially true for SAMs of rigid thiols, for which even conformational adjustment is not possible. SAMs of 4-mercaptobiphenyls are superior to those of alkanethiolates in providing stable model surfaces, as well as in the ability to engineer surface dipole moments. Coupled with the ability to engineer surface functionalities at the molecular level, SAMs and mixed SAMs of rigid thiol offer unique surfaces for nucleation and growth of inorganic and organic crystals.

Silane SAMs have been used to promote heterogeneous nucleation and growth of iron hydroxide crystals and to study the effect of surface chemistry on calcite nucleation, attachment, and growth. For example, $CaCO_3$ has been crystallized on surfaces of alkanethiolate SAMs on gold and SAMs of functionalized alkanethiols can control the oriented growth of calcite. Also, the heterogeneous nucleation and growth of malonic acid ($HOOCCH_2COOH$) has occurred on surfaces of alkanethiolate SAMs on gold that terminated with carboxylic acid and with methyl groups.

U.S. Pat. No. 6,645,293 to Allan S. Myerson discloses methods for the crystallization of nano-size crystals of molecular organic compounds while operating at a low supersaturation. The methods are based on controlling the domain size available during the crystallization process. In one method, microcontacted printed SAMs with local domain area sizes ranging from 25 $\mu m^2$ to 2500 $\mu m^2$ and fabricated SAMs generated from electron beam lithography, are employed to control the size, orientation, phase, and morphology of the crystal. In another method, a continuous micro-crystallizer having a vessel diameter of 25 microns or less is used to ensure that that the maximum size of the crystals in two dimensions is constrained by the vessel itself. Both methods allow control of supersaturation and growth conditions, as well as manageability over crystallinity and polymorphism, and each method's domain size has the potential for further reduction.

U.S. Pat. No. 7,329,319 to Allan S. Myerson discloses a method for producing crystals and for screening crystallization conditions of chemical materials on distinct metallic islands with specific functional groups, for preparing and screening the conditions necessary to promote a specific polymorph of a crystal, and a means for testing and screening the more precise conditions suitable for achieving a desired size or form of a crystal. This patent relates to a method in which a large number of crystals of a desired size and form can be produced quickly and reproducibly for use in the testing and screening of crystallization conditions, such as the production of crystals in metastable states and the screening of the crystals for different polymorphic forms.

U.S. Pat. No. 7,329,592 to Allan S. Myerson discloses a method for producing crystals and for screening crystallization conditions of chemical materials on distinct metallic islands with specific functional groups by using multi-functional substrates comprising a plurality of self-assembled monolayers having at least two different functionalities, for preparing and screening conditions necessary to promote specific polymorphs of a crystal, and a means for testing and screening the more precise conditions suitable for achieving desired sizes or forms of a crystal. This patent relates to a method for producing crystals and a process for screening crystallization conditions, such as the conditions for the production of crystals in metastable states, using a multi-functional substrate.

Although there are methods for initiating crystallization (including nucleation rates) and growing crystals (including affecting the polymorphic selectivity, patterning of crystal, crystal morphology, and orientation of the crystals), there is a need for methods for more efficiently and successfully producing organic nanocrystals. There also is a need for a method for producing organic nanocrystals of both a desired structure and a desired size by self-assembling monolayers on substrates. It is to these needs and others that the present invention is directed.

BRIEF SUMMARY OF THE INVENTION

Briefly, this invention is a method for preparing organic nanocrystals on substrates using patterns of self-assembled monolayers (SAMs). As the crystal formation proceeds on the defined pattern of SAMs, it is possible to achieve controlled crystal formation due to, for example, the pre-selected size or sizes of the SAM islands formed by the pattern mask. While the general conditions required to grow many crystals on SAMs are known, this invention also provides a means to test and screen the more precise conditions suitable for achieving a desired size or form of a crystal.

In a preferred embodiment, this invention takes advantage of the surface chemistry of SAMs to improve crystal formation. More particularly, combinations of hydrophilic SAMs and hydrophobic SAMs are deposited on patterned substrates. Hydrophilic SAMs can be designed by employing thiol surfactants, while hydrophobic SAMs can be designed by organosilicon monolayers. By depositing SAMs on the substrate, it is possible to create a substrate having functionalized islands comprising hydrophilic SAMs and functionalized surrounding areas on the substrate comprising hydrophobic SAMs. Crystals can be grown on the hydrophilic SAMs and/or on the hydrophobic SAMs. More particularly, nucleation and growth of the crystals can occur both on the functionalized islands and/or on the functionalized surrounding areas. SAMs of one functionality can cause crystals of one morphology or phase to form, while SAMs of another functionality can cause crystals of another morphology or phase to form.

A general method of this invention for preparing crystals comprises:

(a) applying a photoresist film to a substrate;

(b) placing a pattern mask over the photoresist film and subjecting the substrate to photolithography;

(c) removing the pattern mask from the coated substrate;

(d) selectively removing the photoresist film from at least a first portion of the substrate;

(e) subjecting the substrate to a hydrophilic SAMs solution for self-assembling hydrophilic SAMs on certain portions of the substrate surface;

(f) selectively removing the photoresist film from at least a second portion of the substrate; and (g) subjecting the substrate to a hydrophobic SAMs solution for self-assembling hydrophobic SAMs on certain other portions of the substrate surface.

Several illustrative methods, based on the general method, for preparing crystals also are contemplated by this invention. A first illustrative method of the present invention comprises the steps of:

(a) coating a substrate with a photoresist film;

(b) preparing a pattern mask having the desired pattern of islands, placing the pattern mask on the coated substrate, and subjecting the coated substrate to the appropriate wavelength of light (photolithography);

(c) removing the pattern mask from the coated substrate and then removing the photoresist film from the areas of the substrate not exposed to the light;

(d) depositing at least one metal layer over the photoresist film (photoresist mask) such that the at least one metal layer coats at least the substrate surface exposed (the pattern of islands) through the photoresist mask;

(e) removing the remaining photoresist film (photoresist mask) exposed to the light from the coated substrate leaving a pattern of metallic islands;

(f) self-assembling hydrophilic SAMs on the metallic islands; and (g) self-assembling hydrophobic SAMs on the now exposed substrate surface surrounding the metallic islands.

A second illustrative method of the present invention comprises the steps of:

(a) coating a substrate with a photoresist film;

(b) preparing a pattern mask having the desired pattern of islands, placing the pattern mask on the coated substrate, and subjecting the coated substrate to the appropriate wavelength of light (photolithography);

(c) removing the pattern mask from the coated substrate and then removing the photoresist film from the areas of the substrate not exposed to the light;

(d) self-assembling hydrophilic SAMs on the substrate surface exposed (the pattern of islands) through the photoresist mask;

(e) removing the remaining photoresist film exposed to the light from the coated substrate leaving the pattern of self-assembled hydrophilic SAMs on the substrate; and (f) self-assembling hydrophobic SAMs on the now exposed substrate surface surrounding the self-assembled hydrophilic SAMs.

A third illustrative method of the present invention comprises the steps of:

(a) coating a hydrophilic flexible polymer substrate with a hydrophobic photoresist film;

(b) preparing a pattern mask having the desired pattern of islands, placing the pattern mask on the coated substrate, and subjecting the coated substrate to the appropriate wavelength of light (photolithography); and (c) removing the photoresist film from the areas of the substrate not exposed to the light such that the hydrophilic substrate surface (the pattern of islands) is exposed through the hydrophobic photoresist film.

A fourth illustrative method of the present invention comprises the steps of:

(a) coating a hydrophilic flexible polymer substrate with a photoresist film;

(b) preparing a pattern mask having the desired pattern of islands, placing the pattern mask on the coated substrate, and subjecting the coated substrate to the appropriate wavelength of light (photolithography);

(c) removing the pattern mask and coating hydrophobic material on top of the photoresist film; and (d) removing the photoresist film from the areas of the substrate not exposed to the light such that the hydrophilic substrate surface (the pattern of islands) is exposed through the hydrophobic photoresist film.

A fifth illustrative method of the present invention is microcontact printing and comprises the steps of:

(a) preparing a polydimethylsiloxane (PDMS) stamp;

(b) stamping a substrate to form patterns of and self-assemble hydrophilic SAMs on a substrate through conformal contact; and (c) self-assembling hydrophobic SAMs on the rest area of the substrate, namely the area on the substrate where there are no hydrophilic SAMs.

The substrates can be glass or polymer such as polyethylene, polypropylene, polyurethane, polyepoxy, polyethylene terephthalate, and polyethylene naphthalate, and in some instances metals such as gold, silver, copper, iron, platinum, and palladium.

The metal layer(s) can be deposited onto the substrate using a metal evaporation process. Generally, a metal adlayer such as titanium or chromium is first deposited onto the substrate to promote adhesion between the metal layer and substrate. Metals suitable for use as the metal layer include gold, silver, titanium, platinum, nickel, copper, palladium, and combinations thereof. Preferably, the metal layer is gold and the adlayer is titanium, both of which are deposited onto the substrate using an electron beam evaporator. Such methods for depositing the metal layer onto the substrate may incorporate the use of a mesh or a photoresist polymer.

Once the patterns have been created on the substrate, SAMs can deposited on the substrate by subsequent immersions in surfactant materials or by otherwise contacting the surfactant materials to the substrate. For example, the substrate can be first immersed into the first surfactant material so to create a SAM with a specific chemical functional head group formed on the islands. Subsequently, the substrate is soaked in a second surfactant material so to create a SAM with a specific chemical functional head group formed on the rest area, with the second surfactant wetting the rest area of the substrate not covered by the islands.

A crystal is prepared on the island from a solution droplet under a set of defined parameters. As the parameters influence the size and form of crystal formation, it is possible to determine the condition for growing a crystal of a desired size and form by testing various parameters. For example, the size of the island, the structure of the island, and the solution concentration all can affect the size of the resultant crystal. That is, the conditions for crystallization may be selected to promote a specific form or size (or range of sizes) of crystal. While the crystal size is in part controlled by the size of the droplet and the size of the island, the crystal form may be controlled by varying the rate of evaporation (or other supersaturation technique such as antisolvent addition, vapor diffusion, heating and cooling, and the like), the incubation temperature, the concentration of droplet solution, and the chemical functionality of the SAMs. By modifying the characteristics of the droplet, it is possible to obtain crystals of a desired form and size.

One illustrative method for depositing solution droplets upon the islands is by immersion of the substrate into a crystallite solution. Specifically, droplets of the crystallite solution are placed on the islands of the substrate by immersing and soaking the substrate in the crystallite solution. Subsequently, the substrate is slowly withdrawn from the solution such that the solution droplets wet the islands. Solution droplets with defined sizes and shapes are formed on the islands when the patterned surface is immersed in and then slowly withdrawn from the solution. Preferably, the droplet solution contains both seeds (crystallized material) and solvent so to improve crystallization rates. The droplets formed on the islands will eventually crystallize. More specifically, the solution droplets will act or react differently depending on the SAMs they are on. SAMs of one functionality can cause crystals of one type (morphology or phase) to form, while SAMs of another functionality can cause crystals of another type to form.

After the crystals have formed on the islands, the crystals now may be analyzed with or without the removal of the crystals from the substrate, which greatly simplifies the screening of the crystals. The size, morphology, and crystal form may be identified or analyzed by optical, electron, and Raman microscopy. Other analytic techniques such as single crystal and powder x-ray diffraction, particle analyzers, and thermal analysis may be used to identify the crystalline forms on the islands as well. The ability to screen the crystals in this manner greatly increases the efficiency of the screening process in that depending on the island size, hundreds to tens of thousands or more islands can be contained in a relatively small area and thus hundreds to tens of thousands or more crystals can be produced in this relatively small area.

In use and application, this invention provides a means to test and screen crystallization conditions for crystals with desired sizes and forms. The use of the patterned islands provides a quick, reliable, consistent method to provide picoliter volume or smaller solution droplets for the generation of supersaturated solutions, eventually resulting in the patterned crystallization of the solute with controlled size and form. As such, this invention provides a method to prepare crystals and screen crystallization conditions in a high-throughput manner.

These features, and other features and advantages of the present invention, will become more apparent to those of ordinary skill in the relevant art when the following detailed description of the preferred embodiments is read in conjunction with the appended drawings in which like reference numerals represent like components throughout the several views.

BRIEF DESCRIPTION OF THE FIGURES

FIG. 14 is a schematic flow chart of a fourth embodiment of the present invention illustrating patterning on a flexible polymer substrate.

DETAILED DESCRIPTION OF PREFERRED EMBODIMENTS

Figure 1:
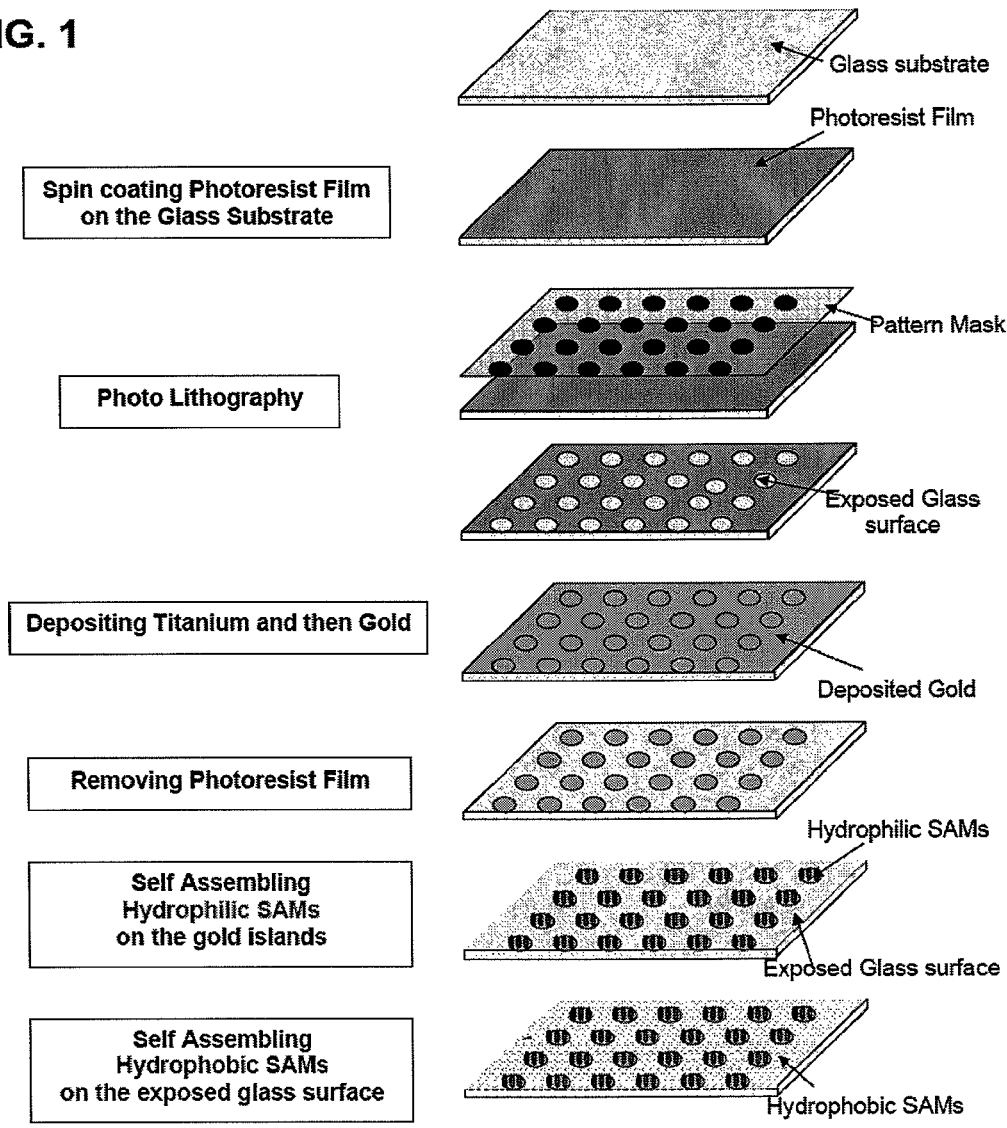
FIG. 1 is a schematic flow chart of a first embodiment of the present invention illustrating patterning on a glass substrate with gold metal deposition.

Preferred embodiments of the present invention are methods for preparing crystals and screening crystallization conditions of chemical materials on distinct metallic islands on a substrate, with the metallic islands being formed by self-assembling hydrophilic SAMs and the rest areas on the substrate between the metallic islands being coated by self-assembling hydrophobic SAMs. Hydrophilic SAMs are located on the islands and hydrophobic SAMs are located on the rest areas so as to generate solution droplets bounded by the size of the islands by wetting polar solutions only to the hydrophilic islands. Therefore, crystallization occurs in a confined volume of solution droplets and the size of crystals produced are controlled by the size of islands. Such embodiments may be used to prepare and screen the conditions necessary to promote specific polymorphs of a crystal of a specific size. As the crystal formation can occur on the distinct metallic islands, and a large number of the distinct metallic islands can be contained in a relatively small area, it is possible to achieve high throughput conditions and controlled crystal formation. While this invention is described herein in conjunction with the preferred embodiments, it will be understood that the invention is not limited to these embodiments.

While the general conditions required to grow many crystals are known, this invention provides a means to grow crystals, and to test and screen the more precise conditions suitable for achieving a desired size or form of a crystal. Generally, SAMs are deposited on patterned substrates having metallic islands exhibiting hydrophilic properties and are surrounded by a hydrophobic rest area. Hydrophilic SAMs can be designed by employing thiol surfactants where the chemical functional head group includes, for example, carboxy (—COOH), hydroxyl (—OH), nitro (—$NO_2$), sulfonic acid (—$SO_3^-$), and phosphonic acid (—$PO_4^-$) functional groups. By depositing hydrophilic SAMs on the substrate as discrete islands, it is possible to create functionalized metallic islands and ensure that crystal formation occurs on the metallic islands. As disclosed herein, a large number of SAMs can be deposited in a relatively small area and the size of the SAMs can be varied so as to be able to provide a significant number of sites for crystal formation and growth and to allow for the crystallization and growth of various sizes and forms of crystals. Thus, nucleation and growth of the crystals can occur on the functionalized metallic islands having a variation of size and/or shape.

Solution droplets having a defined size and shape can be formed on the metallic islands by, for example, immersing and slowly withdrawing the substrate from an unsaturated, saturated or supersaturated solution. Alternatively, the solution may be pipetted onto the metallic islands. Preferably, the SAMs and functional groups are selected to create a preferential bond between the metallic islands and the solution droplets. The solution droplet becomes a more saturated solution by removal of solvent, which is more optimal for crystal growth. Specifically, the solution droplet remains on the surface of the metallic islands during and after supersaturation. Crystallization is confined to the metallic islands due to the patterned surfaces, and the solution wets only the hydrophilic metallic islands.

Thus, one feature of this invention is a method for making distinct hydrophilic metallic islands for the nucleation and growth of crystals for screening purposes. As the SAMs or the functional groups on the SAMs may control crystal formation, it is possible to screen crystallization conditions based on the SAMs on a specific metallic island. Generally, the crystals are grown on the distinct metallic islands and then screened in situ to characterize the crystals as to form, and specifically as to polymorphic form. Functionalized SAMs can serve as heterogeneous nucleants and promote the nucleation of organic, inorganic, and protein crystals.

Droplets of solution containing the materials or compounds of interest are placed on the distinct metallic islands via various methods, such as the immersion method mentioned herein. The solution achieves supersaturation (low, modest or high, depending on the specific circumstances) via known techniques, such as, for Illustrative purposes only, evaporation, vapor diffusion, antisolvent diffusion, oil diffusion, and heating and cooling techniques. The crystallization and supersaturation conditions are controlled, which allows the control of the crystal forms. Once the crystals are formed, the crystals can be characterized or otherwise screened by known techniques, such as Raman microscopy.

Patterning using SAMs is known and has attracted growing attention due to its potential applications in, for example, sensor design and microelectronic devices, in addition to many other uses. To date, structures of various SAMs on gold, with a characteristic scale of 0.1-100 μm, have been generated using microcontact printing, micromachining, focused ion beam writing, photolithography/lift off, and microwriting. For the present invention it has been found that the distinct metallic islands created using SAMs techniques can be varied in size. Islands having a round configuration tend to be the preferred shape for this invention as such configurations are relatively simple to construct on a substrate using pattern masks. The preferred islands have sides in the sub-1000 micron range, with the size of the islands being selected to balance the desired crystal size with the desired numbers of crystals or crystal characterization throughput. Specifically, smaller crystals can be grown on smaller islands while larger crystals can be grown on larger islands, and smaller islands allow for a higher island density (more islands per substrate area) while larger islands allow for a lower island density (fewer islands per substrate area).

A. Patterning Methods

A general method of this invention for preparing crystals comprises:
 (a) applying a photoresist film to a substrate;
 (b) placing a pattern mask over the photoresist film and subjecting the substrate to photolithography;
 (c) removing the pattern mask from the coated substrate;
 (d) selectively removing the photoresist film from at least a first portion of the substrate;
 (e) subjecting the substrate to a hydrophilic SAMs solution for self-assembling hydrophilic SAMs on certain portions of the substrate surface;
 (f) selectively removing the photoresist film from at least a second portion of the substrate; and
 (g) subjecting the substrate to a hydrophobic SAMs solution for self-assembling hydrophobic SAMs on certain other portions of the substrate surface.

Several illustrative methods, based on the general method, for preparing crystals also are contemplated by this invention:
 1. Patterning on a glass substrate with gold deposition. An illustrative method of the present invention for patterning on a glass substrate with gold deposition is shown in FIG. 1 and comprises the steps of:
 (a) coating a substrate with a photoresist film;
 (b) preparing a pattern mask having the desired pattern of islands, placing the pattern mask on the coated substrate, and subjecting the coated substrate to the appropriate wavelength of light (photolithography);
 (c) removing the pattern mask from the coated substrate and then removing the photoresist film from the areas of the substrate not exposed to the light;
 (d) depositing at least one metal layer over the photoresist film (photoresist mask) such that the at least one metal layer coats at least the substrate surface exposed (the pattern of islands) through the photoresist film;
 (e) removing the remaining photoresist film (photoresist mask) exposed to the light from the coated substrate leaving a pattern of metallic islands;

(f) self-assembling hydrophilic SAMs on the metallic islands; and (g) self-assembling hydrophobic SAMs on the now exposed substrate surface surrounding the metallic islands.

Figure 2:
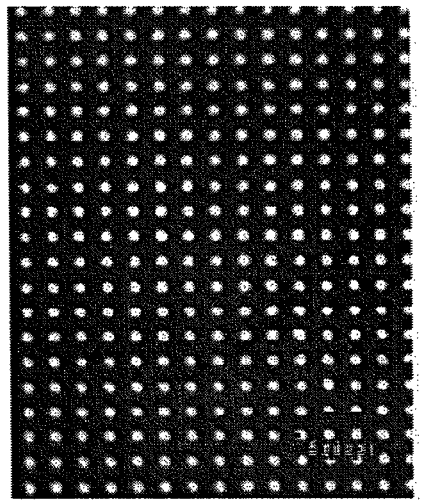
FIG. 2 is an optical micrograph image of small gold islands on a patterned substrate according to FIG. 1 of the present invention.
Figure 3:
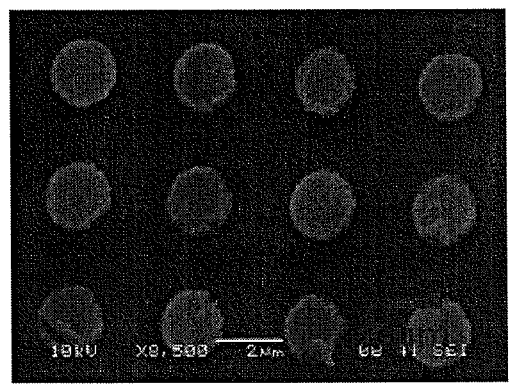
FIG. 3 is a SEM image of small gold islands on a patterned substrate according to FIG. 1 of the present invention.
Figure 4:
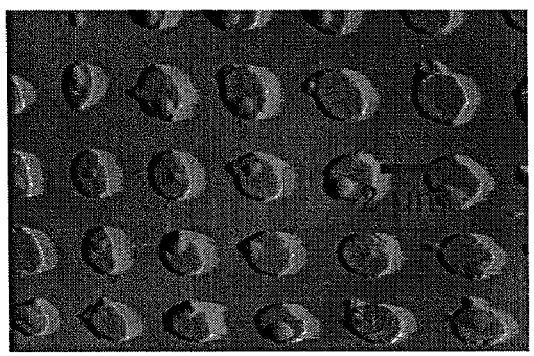
FIG. 4 is an AFM image of glycine crystals grown on small gold islands according to FIG. 1 of the present invention.
Figure 5:
FIG. 5 is an AFM image of a glycine crystal particle grown on a small gold island according to FIG. 1 of the present invention.

FIG. 1 is a schematic flow chart of this first embodiment illustrating patterning on a glass substrate with gold metal deposition. FIG. 2 is an optical micrograph image of small gold islands on a patterned substrate after the metal layer has been deposited and the photoresist mask removed. FIG. 3 is a SEM image of the small gold islands on a patterned substrate after the metal layer has been deposited and the photoresist mask removed. FIG. 4 is an AFM image of glycine crystals grown on the small gold islands. FIG. 5 is an AFM image at higher magnification of a glycine crystal particle grown on a small gold island.

Figure 6:
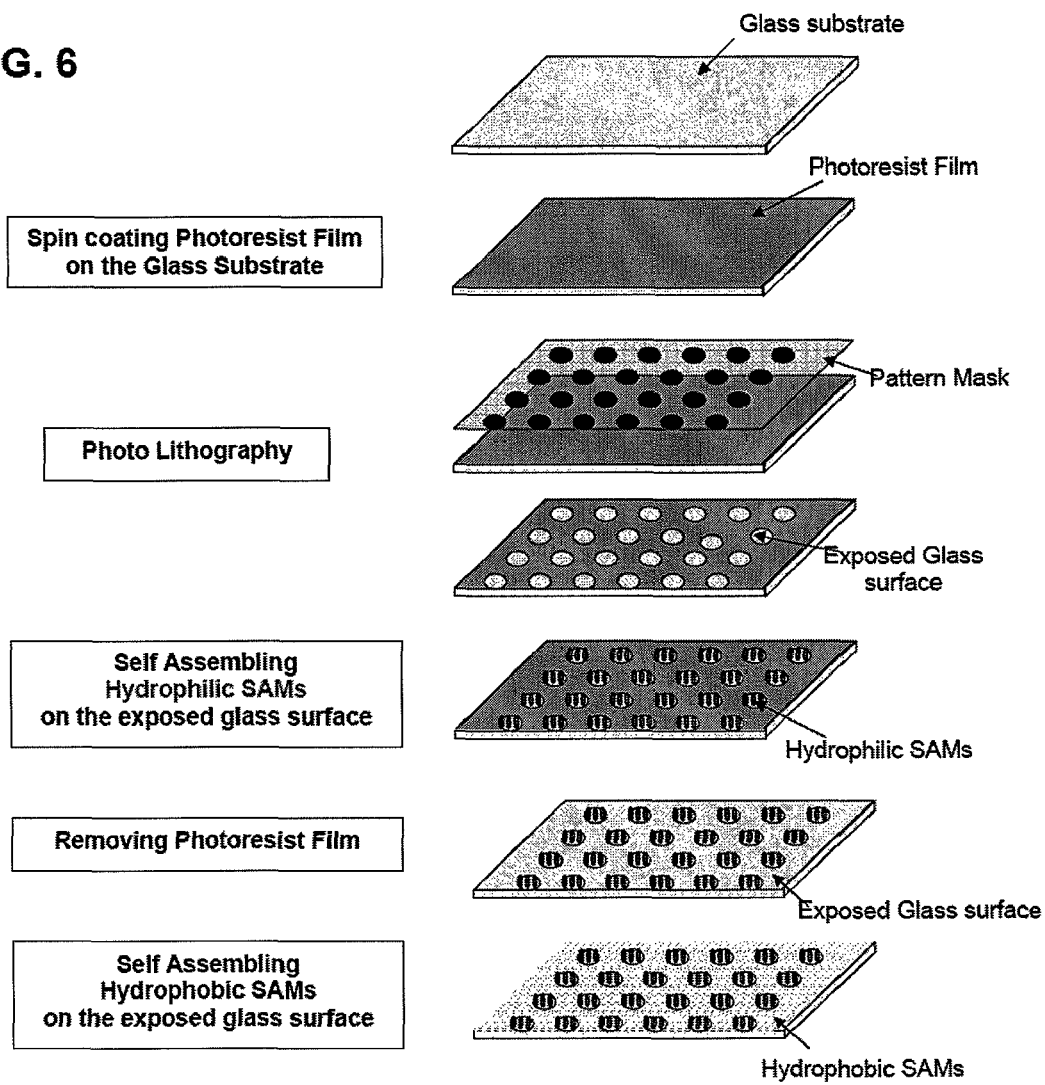
FIG. 6 is a schematic flow chart of a second embodiment of the present invention illustrating patterning on a glass substrate without gold metal deposition.

2. Patterning on a glass substrate without gold deposition. An illustrative method of the present invention for patterning on a glass substrate without gold deposition is shown in FIG. 6 and comprises the steps of:

(a) coating a substrate with a photoresist film;

(b) preparing a pattern mask having the desired pattern of islands, placing the pattern mask on the coated substrate, and subjecting the coated substrate to the appropriate wavelength of light (photolithography);

(c) removing the pattern mask from the coated substrate and then removing the photoresist film from the areas of the substrate not exposed to the light;

(d) self-assembling hydrophilic SAMs on the substrate surface exposed (the pattern of islands) through the photoresist mask;

(e) removing the remaining photoresist film exposed to the light from the coated substrate leaving the pattern of self-assembled hydrophilic SAMs on the substrate; and (f) self-assembling hydrophobic SAMs on the now exposed substrate surface surrounding the self-assembled hydrophilic SAMs.

Figure 7:
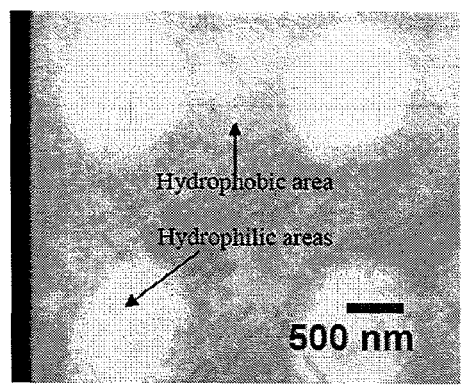
FIG. 7 is an AFM image of a patterned substrate according to FIG. 6 of the present invention.
Figure 8:
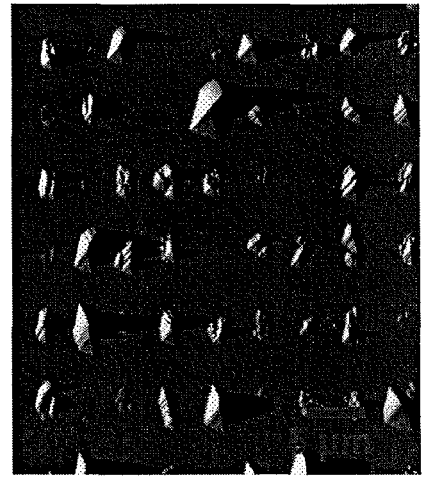
FIG. 8 is an AFM image of glycine crystals grown on a patterned substrate according to FIG. 6 of the present invention.
Figure 9:
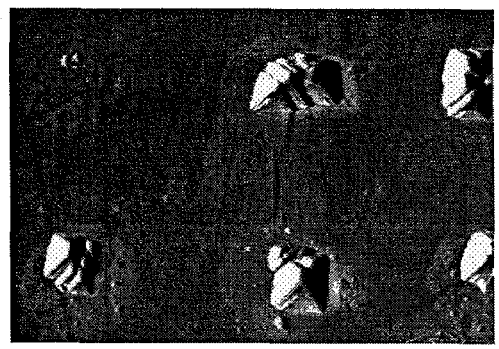
FIG. 9 is an AMF image of glycine crystals grown on a patterned substrate according to FIG. 6 of the present invention.
Figure 10:
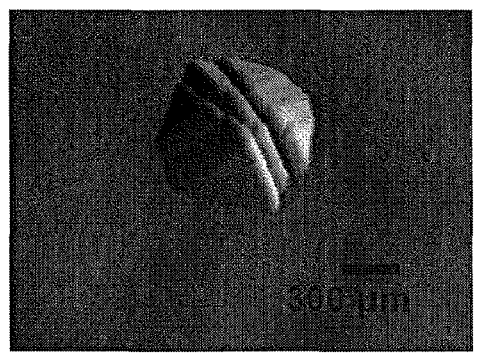
FIG. 10 is an AFM image of glycine crystals grown on a patterned substrate according to FIG. 6 of the present invention.

FIG. 6 is a schematic flow chart of this second embodiment illustrating patterning on a glass substrate without gold metal deposition. FIG. 7 is an AFM image of a patterned substrate after both the hydrophilic SAMs and the hydrophobic SAMs have been self-assembled on the substrate. FIG. 8 is an AFM image of glycine crystals grown on the patterned substrate. FIG. 9 is an AMF image of glycine crystals grown on the patterned substrate at higher magnification. FIG. 10 is an AFM image of glycine crystals grown on the patterned substrate at even higher magnification.

3. Patterning on a flexible polymer substrate (aqueous solution only). An illustrative method of the present invention for patterning on a flexible polymer substrate using only an aqueous solution is shown in FIG. 11 and comprises the steps of:

(a) coating a hydrophilic flexible polymer substrate with a hydrophobic photoresist film;

(b) preparing a pattern mask having the desired pattern of islands, placing the pattern mask on the coated substrate, and subjecting the coated substrate to the appropriate wavelength of light (photolithography); and (c) removing the photoresist film from the areas of the substrate not exposed to the light such that the hydrophilic substrate surface (the pattern of islands) is exposed through the hydrophobic photoresist film.

Figure 11:
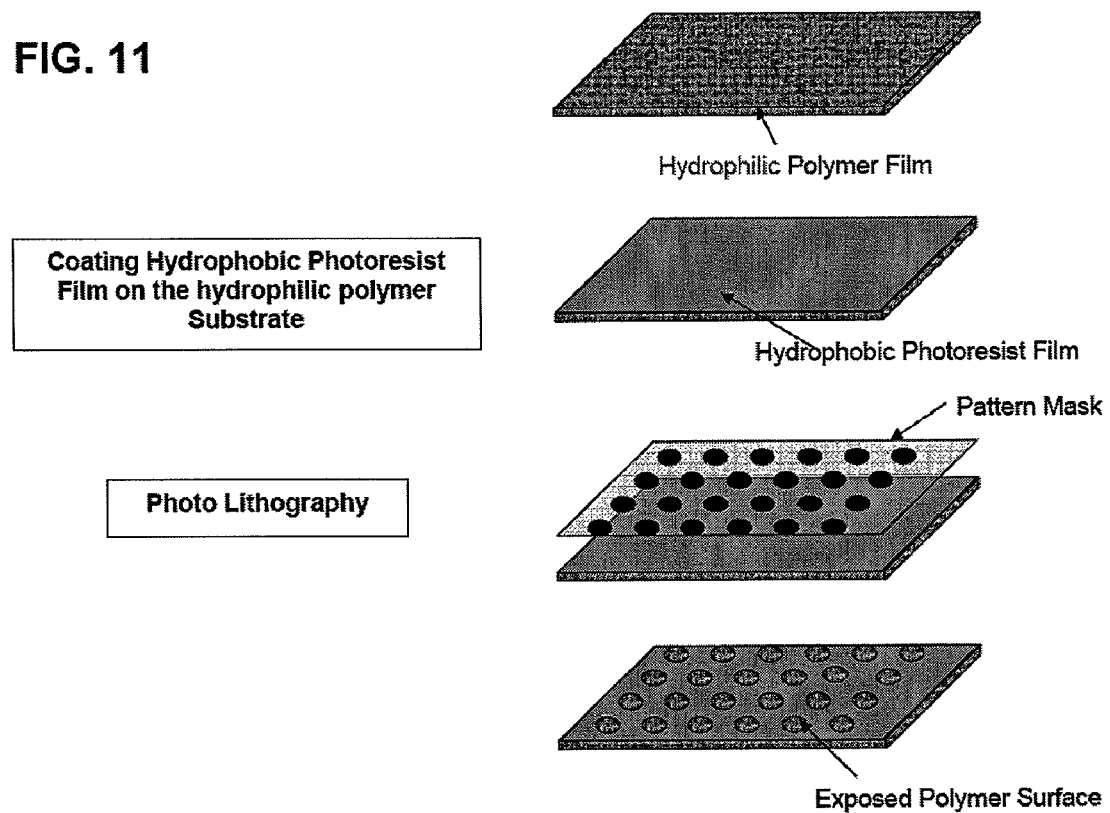
FIG. 11 is a schematic flow chart of a third embodiment of the present invention illustrating patterning on a flexible polymer substrate.
Figure 12:
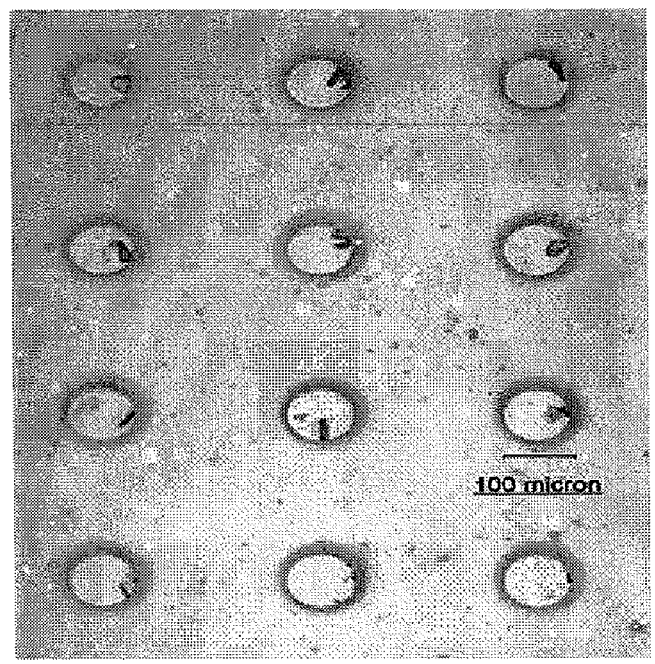
FIG. 12 is an optical micrograph image of glycine crystals grown on a patterned polymer substrate according to FIG. 11 of the present invention.
Figure 13:
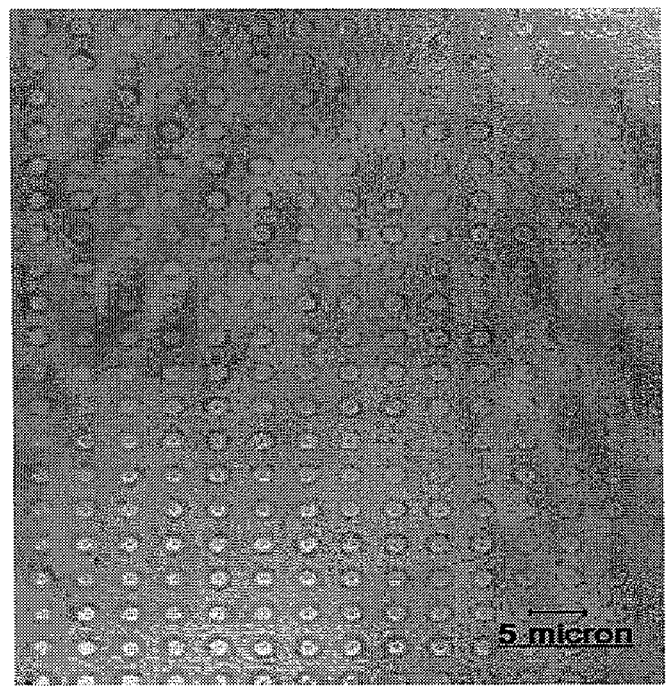
FIG. 13 is an optical micrograph image of small islands on a patterned polymer substrate according to FIG. 11 of the present invention.

FIG. 11 is a schematic flow chart of this third embodiment illustrating patterning on a flexible polymer substrate. FIG. 12 is an optical micrograph image of glycine crystals grown on the patterned polymer substrate. FIG. 13 is an optical micrograph image of small islands on the patterned polymer substrate.

4. Patterning on a flexible polymer substrate. An illustrative method of the present invention for patterning on a flexible polymer substrate is shown in the schematic flowchart of FIG. 14 and comprises the steps of:

(a) coating a hydrophilic flexible polymer substrate with a photoresist film;

(b) preparing a pattern mask having the desired pattern of islands, placing the pattern mask on the coated substrate, and subjecting the coated substrate to the appropriate wavelength of light (photolithography);

(c) removing the pattern mask and coating hydrophobic material on top of the photoresist film; and (d) removing the photoresist film from the areas of the substrate not exposed to the light such that the hydrophilic substrate surface (the pattern of islands) is exposed through the hydrophobic photoresist film.

Figure 15:
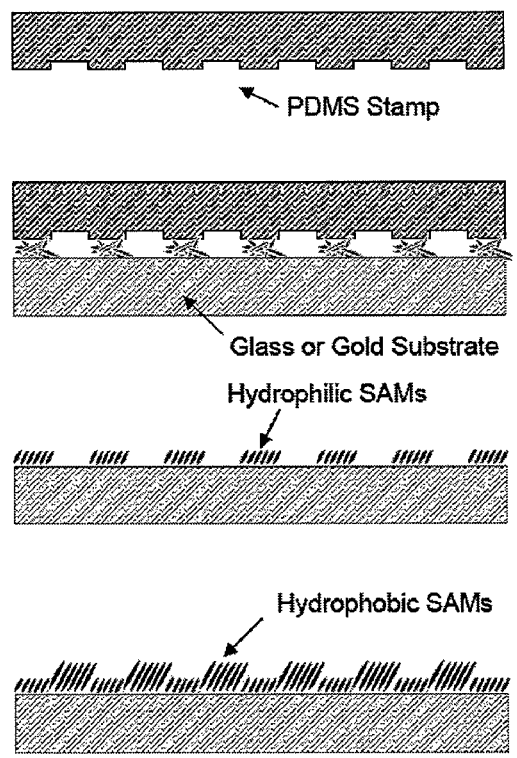
FIG. 15 is a schematic flow chart of a fifth embodiment of the present invention illustrating microcontact printing.

5. Microcontact printing. An illustrative method of the present invention for microcontact printing is shown in the schematic flowchart of FIG. 15 and comprises the steps of:

(a) preparing a polydimethylsiloxane (PDMS) stamp;

(b) stamping a substrate to form patterns of and self-assemble hydrophilic SAMs on a substrate through conformal contact; and (c) self-assembling hydrophobic SAMs on the rest area of the substrate, namely the area on the substrate where there are no hydrophilic SAMs.

The substrates can be glass or polymer such as polyethylene, polypropylene, polyurethane, polyepoxy, polyethylene terephthalate and polyethylene naphthalate and in some instances metals such as gold, silver, copper, iron, platinum, and palladium.

B. Parameters for Substrate Preparation

The substrate can be prepared using SAMs techniques so that it has metallic islands. The substrate (such as a glass slide, a silicon wafer, or a polymer) is prepared so that the metallic islands are hydrophilic and the backfill rest area is hydrophobic. Generally, the substrate comprises a first layer selected from the group consisting of glass, polymer, and metal; a second layer comprising hydrophilic SAMs and hydrophobic SAMs, wherein the hydrophilic SAMs are located only on discrete islands on the first layer and the hydrophobic SAMs are located only on areas of the first layer free of hydrophilic SAMs. The islands provide the location where crystals ultimately can be grown and the differences in material of the backfill and the islands help to ensure that the crystals grow on the islands. Thus, hydrophilic SAMs are located on the islands and hydrophobic SAMs are located on the rest areas so as to generate solution droplets bounded by the size of the islands by wetting polar solutions only to the hydrophilic islands. Therefore, crystallization occurs in a confined volume of solution droplets and the size of crystals produced are controlled by the size of islands.

The islands may be fabricated by using photolithographic techniques. A photoresist pattern can be formed on the substrate with the dimensions of the islands controlled by a pattern mask. Using this method, the substrate is spincoated with a photoresist film (a material that hardens when exposed to light). The pattern mask, with a pattern of islands, can be applied on top of the photoresist film. The substrate then can be exposed to a light source to create a pattern of islands on the substrate (photolithography). The size and shape of the islands may be controlled by controlling the pattern of the pattern mask.

As the photoresist film becomes insoluble when exposed to ultraviolet light, a photoresist pattern based on the pattern mask is created. This process leaves a pattern of hardened portions of the photoresist film on the substrate. In the first embodiment of this invention, the metal for the metallic islands then is evaporated onto the substrate, over the photoresist mask, and the metal adheres to the substrate in the unmasked spaces of the photoresist film forming the metallic islands, and also to the photoresist mask. The pattern mask then is removed from the substrate leaving only the metallic islands. Specifically, the size and pattern of the islands is dictated by the pattern mask.

In the first embodiment (FIGS. 1-5), the metal layer may be deposited first onto the substrate and pattern mask using a metal evaporation process. Such evaporation processes are able to deposit the metal onto the substrate and a metal adlayer is usually employed to promote adhesion between the substrate and any future metal layers. Metals suitable for use as the preferred metal layer include gold, silver, palladium, copper, platinum, nickel, and combinations thereof, while metals suitable for the preferred metal adlayer include titanium and chromium. Preferably, the metal layer is gold and the adlayer is titanium, which may be deposited onto the substrate using an electron beam evaporator. Such methods for depositing the metal layer onto the substrate are known or readily determinable by those with ordinary skill in the art without undue experimentation. FIGS. 2 and 3 show gold islands formed in this manner.

Using this liftoff photoresist mask method, in the first embodiment, the metal layer is applied across the photoresist mask so to create a distinct and defined pattern of metallic islands. As the metal is deposited on the substrate only through the open sections of the photoresist mask, the size and shape of the pattern of the metallic islands are determined by the open sections and pattern of the photoresist mask. After the photoresist mask has been removed from the substrate, a pattern of metallic islands is revealed on the substrate. Preferably, the photoresist mask has open sections ranging from 3 microns to 1000 microns and has a relatively uniform pattern. The size and shape of the metallic islands may be controlled by controlling the pattern of the photoresist mask. The substrate is subjected to a hydrophilic SAMs solution, which self-assemble hydrophilic SAMs on the hydrophilic metal islands. The substrate then is subjected to a hydrophobic SAMs solution, which self-assemble hydrophobic SAMs on the back fill rest areas.

In the first embodiment, the substrate is constructed by:
(a) coating the first layer with a photoresist film;
(b) preparing a pattern mask having a desired pattern of the islands, placing the pattern mask on the coated first layer, and subjecting the coated first layer to photolithography at a appropriate wavelength of light;
(c) removing the pattern mask from the coated first layer and then removing the photoresist film from areas of the first layer not exposed to the light;
(d) depositing at least one metal layer over the photoresist film such that the at least one metal layer coats at least the first layer surface exposed (the pattern of islands) through the photoresist mask;
(e) removing the remaining photoresist film exposed to the light from the coated first layer leaving a pattern of metallic islands;
(f) self-assembling the hydrophilic SAMs on the metallic islands; and
(g) self-assembling the hydrophobic SAMs on the now exposed first layer surface surrounding the metallic islands.

In the second through fourth embodiments, a metal layer is not deposited on the substrate. In the second embodiment (FIGS. 6-10), the photoresist film is applied to the substrate, a pattern mask is placed over the photoresist film, and the substrate is subjected to photolithography. The pattern mask from is removed from the coated substrate and then the photoresist film is removed from the areas of the substrate not exposed to the light. The substrate then is subjected to a hydrophilic SAMs solution for self-assembling hydrophilic SAMs on the exposed substrate surfaces, which also are termed islands, but are not metallic islands. Then the remaining photoresist film is removed, and then the substrate is subjected to a hydrophobic SAMs solution for self-assembling hydrophobic SAMs on the exposed substrate back fill rest area surfaces. FIG. 7 shows hydrophilic and hydrophobic areas formed in this manner.

In the second embodiment, the substrate is constructed by:
(a) coating first layer with a photoresist film;
(b) preparing a pattern mask having a desired pattern of the islands, placing the pattern mask on the coated first layer, and subjecting the coated first layer to photolithography at an appropriate wavelength of light;
(c) removing the pattern mask from the coated first layer and then removing the photoresist film from areas of the first layer not exposed to the light;
(d) self-assembling the hydrophilic SAMs on the first layer surface exposed (the pattern of islands) through the photoresist film;
(e) removing the remaining photoresist film exposed to the light from the coated first layer leaving the pattern of self-assembled hydrophilic SAMs on the first layer; and
(f) self-assembling the hydrophobic SAMs on the now exposed first layer surface surrounding the self-assembled hydrophilic SAMs.

In the third embodiment (FIGS. 11-13), a hydrophobic photoresist film is applied to a hydrophilic flexible polymer substrate, a pattern mask is placed over the photoresist film, and the substrate is subjected to photolithography. The pattern mask is removed from the coated substrate and then the photoresist film is removed from the areas of the substrate not exposed to the light. Then, the hydrophilic substrate surface (the pattern of islands) is exposed through the hydrophobic photoresist film. FIG. 13 shows islands formed in this manner.

In the third embodiment, the first layer is a hydrophilic flexible polymer and the substrate is constructed by:
(a) coating the first layer with a hydrophobic photoresist film;
(b) preparing a pattern mask having a desired pattern of the islands, placing the pattern mask on the coated first layer, and subjecting the coated first layer to photolithography at an appropriate wavelength of light; and
(c) removing the photoresist film from the areas of the first layer not exposed to the light such that the hydrophilic first layer surface (the pattern of islands) is exposed through the hydrophobic photoresist film In the fourth embodiment (FIG. 14), the photoresist film is applied to the substrate, a pattern mask is placed over the photoresist film, and the substrate is subjected to photolithography. The pattern mask is removed from the coated substrate. The substrate then is subjected to a hydrophobic material solution, which coats hydrophobic materials on top of the photoresist film and then the photoresist film is removed from the areas of the substrate not exposed to the light. Then, the hydrophilic substrate surface (the pattern of islands) is exposed through the photoresist film coated with hydrophobic materials.

In the fourth embodiment, the first layer is a hydrophilic flexible polymer and the substrate is constructed by:
(a) coating the first layer with a photoresist film;

(b) preparing a pattern mask having a desired pattern of the islands, placing the pattern mask on the coated first layer, and subjecting the coated first layer to photolithography at an appropriate wavelength of light;

(c) removing the pattern mask and coating hydrophobic material on top of the photoresist film; and (d) removing the photoresist film from the areas of the first layer not exposed to the light leaving the hydrophilic first layer surface (the pattern of islands) is exposed through the hydrophobic photoresist film.

In the fifth embodiment (FIG. 15), the substrate may be coated with a metal layer or left uncoated. Whether coated or not, a PDMS stamp is used to apply the hydrophilic SAMs to the substrate. The patterned areas left by the PDMS stamp also are termed islands. The substrate then is subjected to a hydrophobic SAMs solution for self-assembling hydrophobic SAMs on the exposed substrate back fill rest area surfaces.

In the fifth embodiment, the substrate is constructed by:
(a) preparing a polydimethylsiloxane (PDMS) stamp;
(b) contacting the stamp to a hydrophilic SAMs solution;
(c) stamping the first layer to form patterns of the self-assembled hydrophilic SAMs on the first layer through conformal contact; and
(c) self-assembling the hydrophobic SAMs on the rest area of the substrate where there are none of the hydrophilic SAMs.

The SAMs include both thiol and silane based surfactant molecules. Possible surfactants include, but are not limited to, short and long chain alkanethiols, $SH(CH_2)_nX$, and aromatic thiolates, $SH(C_6H_5)_nX$, where n represents the chain lengths (or repeating units) and X represents organic and inorganic functional tail groups that include, but are not limited to, $CO_2^-$, $SO_3^-$, $PO_3^-$, $NH_3^+$, $N(CH_3)_3^+$, $NO_2$, $OH$, $CH_3$, $CF3$, $F$, $Cl$, $Br$, $I$, $CO_2CH_3$, $SH$, $C_2H_4OH$ and $SCH_3$. While the second surfactant material for creating the second SAMs to be used as the backfill may have chemical head groups similar to those of the first surfactant material for creating the first SAMs, preferably the chemical head group of the second surfactant material is different from that of the first surfactant material. Preferably, the second surfactant material is selected so that is does not form a strong bond with a solution droplet (is hydrophobic). One of ordinary skill in the art may select surfactant materials without undue experimentation so to optimize the bond between the SAM and the substrate and to place a desired functional group on the metallic islands.

The size of the islands and the density of the islands on the substrate can be selected based on the size of the crystal desired, the number of crystals desired, or a balancing of these two factors. Specifically, for larger crystals, larger islands are preferred (resulting in a lower island density on the substrate and a lower average throughput) and for higher throughputs, smaller islands are preferred (resulting in a higher island density on the substrate and smaller crystals). Further, the islands can exist in a gradient of sizes, which provides for testing or screening an array of conditions. Those of ordinary skill in the art can produce islands of a desired size without undue experimentation.

C. Preparing and Growing Crystals

Crystals are prepared on the islands from solution droplets under a set of defined parameters. Crystallization parameters including temperature, solvent or mixture of solvents used, and concentration can also be examined with the substrate as the combination of these factors can lead to the appearance of new phases. Due to the large complexity of the molecule, proteins are relatively difficult to crystallize and are sensitive to the crystallization conditions, which include the environment, temperature, pH, buffer and ionic strength. As the parameters influence the size and form of crystal formation, it is possible to determine the particular conditions for growing a crystal of a desired size and form by testing various parameters.

The substrate provides a background in which a droplet of droplet solution may be tested for its ability to crystallize. Solution droplets of various concentrations can be deposited on the islands for crystallization under desired conditions, which may be varied for high-throughput testing. The patterned islands provide a quick, reliable, consistent method to provide picoliter volumes or smaller solution droplets for the generation of supersaturated solutions resulting in the patterned crystallization of the solute with controlled size. Preferably, crystallization of organic nanocrystals is constrained to the islands for ordered crystallization. The crystallite solution can achieve supersaturation (low, modest or high, depending on the specific circumstances) via known techniques, such as, for illustrative purposes only, evaporation, vapor diffusion, antisolvent diffusion oil diffusion, and heating and cooling techniques. One method for depositing solution droplets upon the islands is by immersion of the substrate into a crystallite solution. This method is preferred for the formation of similar composition crystals on all of the islands on the substrate, even if the islands have different sizes and/or different SAMs functionalities. In one embodiment, the immersion and slow withdrawal of the substrate in a solution (containing the solute and solvent) produces the formation of array of droplets on the hydrophilic areas. Alternatively, the solution droplets may be deposited on the islands by a pipette. This method is preferred for the formation of different composition crystals on individual islands on the substrate.

As the SAMs on the islands preferentially bind the crystallite solution, droplets of the crystallite solution are formed on the islands by immersing and soaking the substrate in the crystallite solution. Subsequently, the substrate is slowly withdrawn from the solution such that the solution droplets bind to the islands. The solution drops with defined, size and shapes are formed on the islands when the patterned surface of the substrate is immersed and slowly withdrawn from the solution. The droplets formed on the islands will eventually crystallize.

While the crystal size can in part be controlled by the size of the droplet and the size of the islands, the crystal form may be controlled by varying the rate of evaporation or other supersaturation technique, the incubation temperature, the concentration of droplet solution, and the chemical functionality of the SAMs. One of ordinary skill in the art can select and test conditions for producing a crystal of a desired form and size without undue experimentation by, for example, varying the size and shape of the islands, by varying the supersaturation technique, by varying the initial concentration of the crystallite solution, and by varying the composition of the SAMs. By modifying the characteristics of the droplet, it is possible to obtain a crystal of a desired form and size.

Preferably, the droplet solution contains both seeds (crystallized material) and solvent. The seeds can provide a starting point for nucleation of the crystal and the solvent is for providing additional material for the crystal to grow. As the solution droplet contains seeds, the droplet need not undergo spontaneous crystallization, which in many instances can be rate limiting. As such, the time needed for crystallization is shorter.

FIGS. 4, 5, 8, 9, 10, and 12 show exemplary formed nanosized crystals grown on islands according to the present invention. Once a crystal has formed on the island, chemical, mechanical, and physical techniques (such as for example sonication and vibration) are suitable for removing the crystal from the island. In one embodiment, the crystal may be detached from the island by sonicating the crystallized substrate in an anti-solvent. Also the crystals may be removed in dry powder form by placing a sonic probe on the back of the substrate and vibrating the surface rigorously to release the crystals. One of ordinary skill in the art may remove the crystals from the substrate using these and other conventional techniques.

D. Screening Crystals

The crystals may be analyzed with or without the removal of the crystals from the substrate. The size, morphology, and crystal form may be identified or analyzed by optical, electron, and Raman microscopy. Other analytic techniques such as single crystal and powder x-ray diffraction, particle analyzers, and thermal analysis may be used to identify the crystalline forms on the islands as well. For example, once the crystals are formed, the crystals can be characterized or otherwise screened by known techniques, such as Raman microscopy, without removing the crystals from the islands. By providing for the nucleation and growth of the crystals and the screening of the crystals on the islands, the present invention is a highly efficient method of screening crystals using the small distinct islands without having to handle the crystals any more than is necessary or desired.

In terms of polymorph screening, the bulk solution from which the solution droplets emanate may contain various forms of a crystal, such as a stable $\alpha$-polymorph and a metastable $\beta$-polymorph. Metastable forms have a tendency to change quickly to the more stable form. In the present invention, the crystals are grown on a solid, namely, the distinct islands. As a result, crystals of the metastable polymorph can grow on the distinct islands, resulting in the production of more and better metastable (or other) polymorphs. The growth of the crystals on the solid islands helps to prevent the conversion of the metastable crystals to the more stable crystals as solid state conversion is less likely to occur than liquid state conversion.

High throughput screening methods are known and are suitable for use in the present invention. For example, the use of a rectangular array of individual samples to be screened in combination with mechanisms for manipulating the rectangular array are well known. A first illustrative screening method is for the rectangular array to remain motionless and for a screening device to be moved so as to impinge sequentially upon each distinct island. A second illustrative screening method is for the screening device to remain motionless and for the rectangular array to be moved such that the screening device sequentially impinges upon each distinct island. Other such high throughput screening methods are known and are suitable for the present invention, including, for example, screening methods that are non-sequential or screen more than one sample at once.

These methods can be carried out under a variety of conditions, enabling one to explore the polymorph landscape and nucleation domain. Moreover, the substrate can be coupled with high throughput methodologies for analytical characterization. For example, the size and shape of the crystals can be analyzed and identified with both optical microscopy and Raman microscopy, which can be utilized to evaluate the solid forms by comparison with the known polymorphs of the chemical. More specifically, each array of islands can be handled as a discrete screening entity without having to remove the individual crystals from the individual islands. The substrate with the array of islands can be mounted on a device for screening by, for example, a Raman or optical (or combination) microscopy device. In this manner, the microscopy device can be programmed to examine the crystals on each island in the same known manners that such a microscopy can be programmed to examine a sequential array of hanging drops, a sequential array of vessels such as cuvettes, pipettes or test tubes, or a micro-well array of individual micro-wells. Once a Raman spectra, or an optical image, or another spectra or image dependent on the type of microscopy used, is acquired, the spectra image then is analyzed. A basic form of analysis is to compare the spectra or image to a previously compiled database of spectra or images to determine the type of crystal. This can be accomplished using an automated spectra or image classification system, such as those known in the art.

E. Examples of Using the Embodiments

Glycine was selected as an illustrative compound as it is the simplest amino acid and is known to provide a base for extrapolation to other amino acids, proteins and the like. For example, those of ordinary skill in the art recognize that the results of experimentation with glycine are applicable and can be extrapolated to other amino acids, proteins, and the like. Thus, if a method is successful with glycine, it is assumable that the method will be successful with other amino acids, proteins and the like.

An exemplary glycine solution suitable for the present invention is an undersaturated solution of glycine, prepared in a 6.5% w/w ratio of glycine to water (7 gm glycine per 100 gm water). The glycine solution can be deposited on the substrate by immersing the substrate in the glycine solution so that droplets of solution are produced on the islands. Glycine was crystallized on the patterned substrate with islands. The islands were prepared using various patterned masks with various sized openings. After the islands were prepared, hydrophilic SAMs were formed on the islands and hydrophobic SAMs were deposited to the backfill rest area surrounding the islands. As shown in FIGS. 4, 5, 7, 8 and 12, a uniform array of glycine crystals nucleated and crystallized on the islands after the solution droplets on the island were evaporated at room temperature. The position of the crystals was dependent on the direction and orientation of the substrate when it is withdrawn from the solution. Further, the size of the crystal was dependent on the size of the islands.

The foregoing detailed description of the preferred embodiments and the appended figures have been presented only for illustrative and descriptive purposes. They are not intended to be exhaustive and are not intended to limit the scope and spirit of the invention. The embodiments were selected and described to best explain the principles of the invention and its practical applications. One skilled in the art will recognize that many variations can be made to the invention disclosed in this specification without departing from the scope and spirit of the invention.

What is claimed is:

1. A method for growing small crystals having a crystal size of 2 microns or less on substrates comprising the steps of:
    (a) applying a photoresist film to a substrate;
    (b) placing a pattern mask having a desired pattern of islands over the photoresist film and subjecting the substrate to photolithography;
    (c) removing the pattern mask from the coated substrate;
    (d) selectively removing the photoresist film from at least a first portion of the substrate;

(e) subjecting the substrate to a hydrophilic SAMs solution for self-assembling hydrophilic SAMs on certain portions of the substrate surface;
(f) selectively removing the photoresist film from at least a second portion of the substrate; and
(g) subjecting the substrate to a hydrophobic SAMs solution for self-assembling hydrophobic SAMs on certain other portions of the substrate surface,
wherein:
(i) the substrate is a hydrophilic flexible polymer;
(ii) the substrate is coated with a hydrophobic photoresist film;
(iii) the pattern mask is prepared having a desired pattern of islands, the pattern mask is placed on the coated substrate, and the coated substrate is subjected to the photolithography at an appropriate wavelength of light; and
(iv) the photoresist film is removed from the areas of the substrate not exposed to the light such that the hydrophilic substrate surface (the pattern of islands) is exposed through the hydrophobic photoresist film.

2. A method for growing small crystals having a crystal size of 2 microns or less on substrates comprising the steps of:
(a) applying a photoresist film to a substrate;
(b) placing a pattern mask having a desired pattern of islands over the photoresist film and subjecting the substrate to photolithography;
(c) removing the pattern mask from the coated substrate;
(d) selectively removing the photoresist film from at least a first portion of the substrate;
(e) subjecting the substrate to a hydrophilic SAMs solution for self-assembling hydrophilic SAMs on certain portions of the substrate surface;
(f) selectively removing the photoresist film from at least a second portion of the substrate; and
(g) subjecting the substrate to a hydrophobic SAMs solution for self-assembling hydrophobic SAMs on certain other portions of the substrate surface,
wherein:
(i) the substrate is a hydrophilic flexible polymer substrate;
(ii) the substrate is coated with the photoresist film;
(iii) the pattern mask is prepared having a desired pattern of islands, the pattern mask is placed on the coated substrate, and the coated substrate is subjected to the photolithography at an appropriate wavelength of light;
(iv) the pattern mask is removed and hydrophobic material is coated on top of the photoresist film; and
(v) the photoresist film is removed from the areas of the substrate not exposed to the light such that the hydrophilic substrate surface (the pattern of islands) is exposed through the hydrophobic photoresist film.

3. The method as claimed in claim 1, wherein the functional groups of the self-assembled monolayers are selected to create a preferential bond between the islands and a solution droplet comprising a selected substance for crystallization.

4. The method as claimed in claim 3, wherein the solution droplet comprises a crystallite solution for nucleating and growing a crystal and the solution droplet is deposited on the functionalized islands for nucleating and growing the crystals of the selected substance on the functionalized islands.

5. The method as claimed in claim 4, wherein the solution droplet become a more saturated solution by removing solvent by a method selected from the group consisting of evaporation, antisolvent addition, vapor diffusion, oil diffusion, heating and cooling, or combination thereof.

6. The method as claimed in claim 2, wherein the functional groups of the self-assembled monolayers are selected to create a preferential bond between the islands and a solution droplet comprising a selected substance for crystallization.

7. The method as claimed in claim 6, wherein the solution droplet comprises a crystallite solution for nucleating and growing a crystal and the solution droplet is deposited on the functionalized islands for nucleating and growing the crystals of the selected substance on the functionalized islands.

8. The method as claimed in claim 7, wherein the solution droplet become a more saturated solution by removing solvent by a method selected from the group consisting of evaporation, antisolvent addition, vapor diffusion, oil diffusion, heating and cooling, or combination thereof.

* * * * *